United States Patent
Su et al.

(10) Patent No.: US 7,012,305 B2
(45) Date of Patent: Mar. 14, 2006

(54) ELECTRO-STATIC DISCHARGE PROTECTION CIRCUIT FOR DUAL-POLARITY INPUT/OUTPUT PAD

(75) Inventors: Shin Su, Hsinchu (TW); Chun-Hsiang Lai, Hsinchu (TW); Chia-Ling Lu, Hsinchu (TW); Yen-Hung Yeh, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/708,171

(22) Filed: Feb. 12, 2004

(65) Prior Publication Data

US 2005/0133868 A1 Jun. 23, 2005

(51) Int. Cl.
*H01L 23/62* (2006.01)
(52) U.S. Cl. .............. 257/355; 257/173; 257/357; 257/546
(58) Field of Classification Search .......... 257/173, 257/355, 357, 360, 361, 546, 547, 566
See application file for complete search history.

(56) References Cited

U.S. PATENT DOCUMENTS

| | | | | |
|---|---|---|---|---|
| 6,016,002 A | * | 1/2000 | Chen et al. ............ | 257/546 |
| 6,081,002 A | * | 6/2000 | Amerasekera et al. ...... | 257/173 |
| 6,215,135 B1 | * | 4/2001 | Schroder ................ | 257/173 |
| 6,498,357 B1 | * | 12/2002 | Ker et al. .............. | 257/173 |
| 6,538,266 B1 | * | 3/2003 | Lee et al. .............. | 257/173 |

* cited by examiner

*Primary Examiner*—Tom Thomas
*Assistant Examiner*—Matthew E. Warren
(74) *Attorney, Agent, or Firm*—Jianq Chyun IP Office

(57) ABSTRACT

An electro-static discharge (ESD) protection circuit for a dual polarity I/O pad is provided. The protection circuit includes a substrate of first type; a deep well region of second type disposed in the first type substrate; a well region of first type disposed in the second type deep well region; a first transistor disposed over the well region of first type, wherein the first transistor has a first source, a first gate and a first drain; a second transistor disposed over the substrate of first type, wherein the second transistor has a second source, a second gate and a second drain, and the second source is connected with the first drain, and both of them are disposed in a portion of the well region of first type, the deep well region of second type and the substrate of first type; a first doped region is disposed in the first type well region and laterally adjacent to the first source; a second doped region is disposed in the substrate of first type and laterally adjacent to the second drain.

8 Claims, 3 Drawing Sheets

ELECTRO-STATIC DISCHARGE PROTECTION CIRCUIT FOR DUAL-POLARITY INPUT/OUTPUT PAD

BACKGROUND OF INVENTION

1. Field of the Invention

The present invention generally relates to an electro-static discharge (ESD) protection circuit (ESD). More particularly, the present invention relates to an electro-static discharge (ESD) protection circuit for a dual polarity input/output (I/O) pad.

2. Description of the Related Art

The electro-static discharge (ESD) is a phenomenon of the motion of the static electricity generated from a non-conductive surface, and the electro-static discharge (ESD) may damage the component circuits and the semiconductors in the integrated circuit (IC). For example, a human body moving on a carpet may gather several hundred to thousand voltages of static electricity in an environment having a higher relative humidity, and may gather more than ten thousand voltages of static electricity in an environment having a lower relative humidity. In an apparatus for packaging the integrated circuits (ICs) or an apparatus for testing the integrated circuits (ICs), several hundred to thousand voltages of static electricity may also be generated. When a chip is contacted by the electro-static charged body including, for example, the human body, the apparatus or the device described above, the chip will be discharged and the phenomenon is the so-called electro-static discharge (ESD). The surge power of the electro-static discharge (ESD) may damage the integrated circuits (ICs) in the chip.

In order to prevent the damage of the integrated circuits (ICs) due to the electro-static discharge (ESD) phenomenon, in general an electro-static discharge (ESD) protection circuit will be formed in the integrated circuit (IC). Conventionally, the electro-static discharge (ESD) protection circuit is composed of the NMOS transistor or the CMOS transistor, and is provided by the parasitic bipolar junction transistor (parasitic BJT) or the silicon control rectifier (SCR) formed by these transistors to achieve the electro-static discharge (ESD) protection effect. However, the electro-static discharge (ESD) protection circuit is effective if and only if the electro-static discharge (ESD) protection effect is provided without influencing the normal operation of the device.

With respect to the electro-static discharge (ESD) protection circuit, a proper design for the activating voltage is necessary. In other words, when the device is in normal operation, the electro-static discharge (ESD) protection circuit should not be activated unexpectedly. For a device having a dual polarity input/output (I/O) pad, the detection of the static electricity can be classified into a positive polarity situation and a negative polarity situation. In general, when the electro-static discharge (ESD) protection circuit is being attacked by an electro-static current, the circuit may not be burnt or shorted by the heat generation. This is because the current-voltage characteristic (I-V curve) of the parasitic diode or bipolar junction transistor formed by the electro-static discharge (ESD) protection circuit have a characteristics at a high current as shown in FIG. 1. Thus, the circuit design of the electro-static discharge (ESD) protection circuit described above can be practically applied.

However, when the ESD device is operated under a negative bias, because the pn junction existed by nature is capable of only forming a forward-bias diode. The current-voltage characteristic (I-V curve) of the forward-bias diode is shown as the curve in the fourth quadrant of FIG. 1. In the meanwhile, when the device is in normal operation and under a negative bias, the electro-static discharge (ESD) protection circuit may be activated. In other words, when the device is in normal operation and under a negative bias, the electro-static discharge (ESD) protection circuit will adversely influence the normal operation of the device.

SUMMARY OF INVENTION

Accordingly, one object of the present invention is to provide an electro-static discharge (ESD) protection circuit for a dual polarity input/output (I/O) pad so that any adverse effects to the device during its normal operation can be substantially avoided.

In accordance with the above objects and other advantages of the present invention, an electro-static discharge (ESD) protection circuit for a dual polarity I/O pad is provided. The protection circuit comprises a substrate of first type, a deep well region of second type, a well region of first type, a first transistor, a second transistor, a first doped region and a second doped region. The deep well region of second type is disposed in the substrate of first type, and the well region of first type is disposed in the deep well region of second type. Moreover, the first transistor is disposed over the well region of first type, and the first transistor comprises a first gate, a first source and a first drain. The second transistor is disposed over the substrate of first type, and the second transistor comprises a second gate, a second source and a second drain. The second source is connected with the first drain, wherein the second source and the first drain are disposed in a portion of the well region of first type, a portion of the deep well region of second type and a portion of the substrate of first type. Furthermore, the first doped region is disposed in the well region of first type and is positioned laterally adjacent to the first source. The first doped region, the first source and the first gate are electrically connected to an input pad. The second doped region is disposed in the substrate of first type and is positioned laterally adjacent to the second drain. Moreover, the second doped region, the second drain and the second gate are electrically connected to an output pad.

In a preferred embodiment of the present invention, a deep well region of second type is disposed in the substrate of first type, and a well region of first type is disposed in the deep well region of second type, thus a triple well structure is constructed. Thus, a silicon control rectifier (SCR) can be formed by the two transistors. With the protection circuit connected to I/O pad of the device, the operation of the device is protected against any electro-static current regardless of whether the electro-static current is a positive electro-static current or a negative electro-static current. Further, the normal operation of the device is unaffected by protection circuit of the present invention regardless of whether the device is being operated under a positive bias or a negative bias.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The following drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In a preferred embodiment of the present invention, an electro-static discharge (ESD) protection circuit is provided for an I/O pad of an device which is operated under a dual polarity. In other words, the electro-static discharge (ESD) protection circuit of the present invention is capable protecting the device regardless of whether the device is under a positive bias operation or a negative bias operation. Further, the normal operation of the device is unaffected by the electro-static discharge (ESD) protection circuit of the present invention. Hereinafter, the preferred embodiments are provided for detail description of the electro-static discharge (ESD) protection circuit the present invention, but can not be used for limit the scope of the present invention. It is noted that in the following embodiments, the first type and the second type are not limited to, a p-type and a n-type, the first type and the second type can also be a n-type a p-type respectively.

Figure 1:
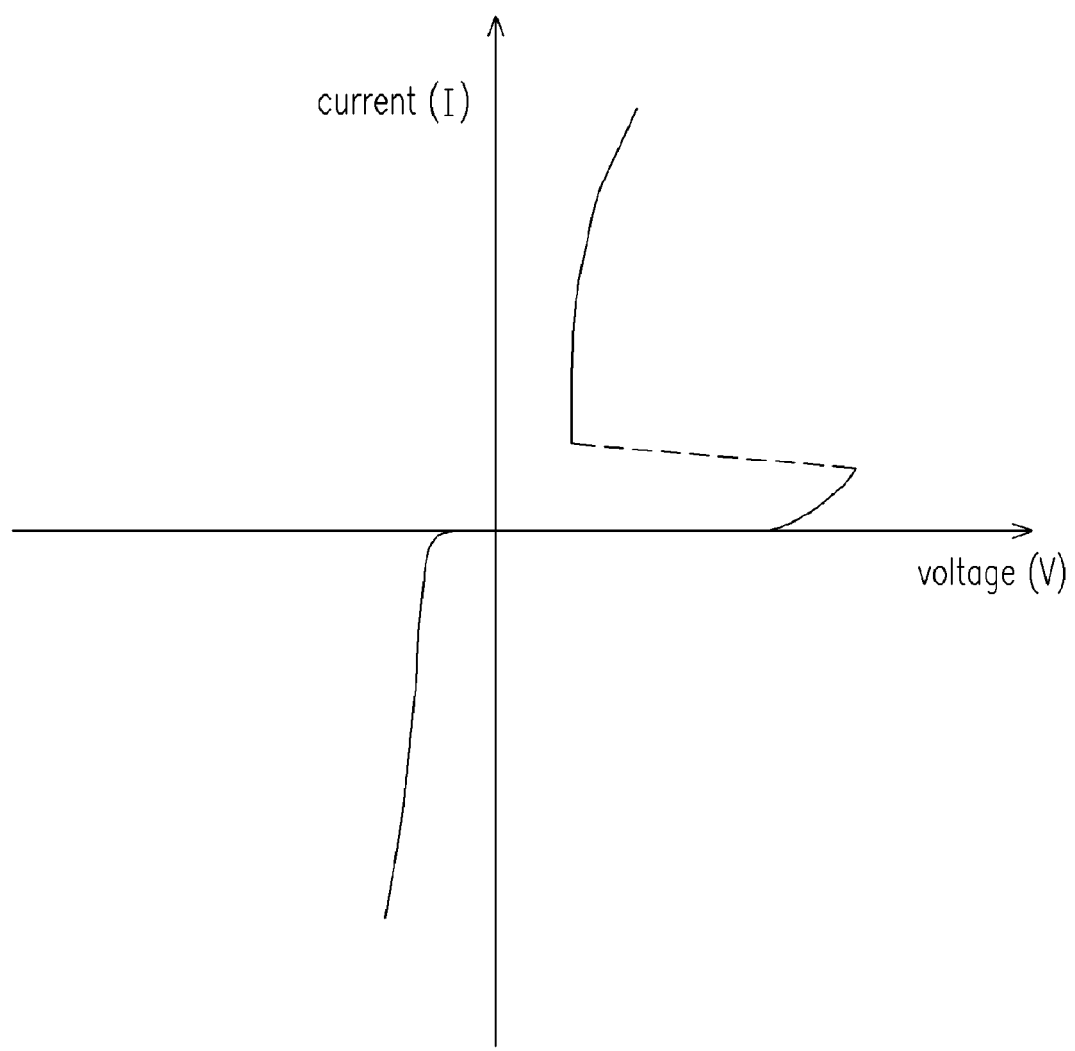
FIG. 1 is a plot of current vs. voltage (I-V curve) of a conventional electro-static discharge (ESD) protection circuit.
Figure 2:
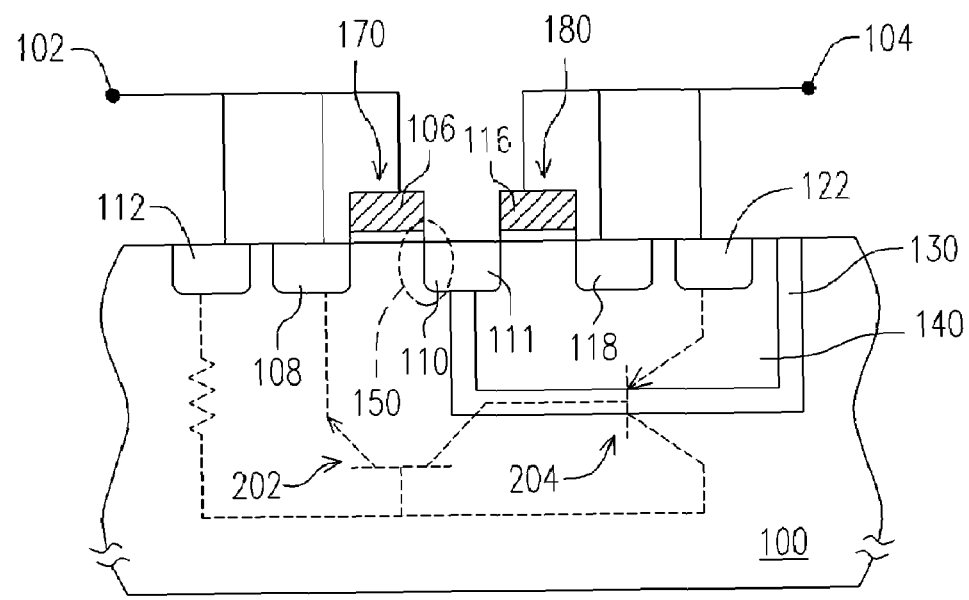
FIG. 2 is a drawing schematically illustrating the formation of a silicon control rectifier (SCR) when the electro-static discharge (ESD) protection circuit is attacked by a positive electro-static current according to a preferred embodiment of the present invention.

FIG. 2 is a cross-sectional view schematically illustrating an electro-static discharge (ESD) protection circuit for a dual polarity I/O pad of a device according to a preferred embodiment of the present invention. Referring to FIG. 2, the electro-static discharge (ESD) protection circuit of the present invention comprises a substrate of first type 100, a deep well region of second type 130, a well region of first type 140, a first transistor 180, a second transistor 170, a first doped region 122 and a second doped region 112.

In a preferred embodiment of the present invention, the substrate of first type 100 is, for example but not limited to, a p-type silicon substrate. The deep well region of second type 130 is, for example but not limited to, a n-type deep well region. The well region of first type 140 is, for example but not limited to, a p-type well region. The first transistor 180 is, for example but not limited to, a NMOS transistor. The second transistor 170 is, for example but not limited to, a NMOS transistor. The first doped region 122 is, for example but not limited to, a p-type doped region. The second doped region 112 is, for example but not limited to, a p-type doped region.

Referring to FIG. 2, then-type deep well region 130 is disposed in the p-type substrate 100, and the p-type well region 140 is disposed in the n-type deep well region 130. Thus, a triple well structure is formed by the p-type substrate 100, the n-type deep well region 130 and the p-type well region 140.

Moreover, the NMOS transistor 180 is disposed over the p-type well region 140, and the NMOS transistor 180 includes a gate 116, a source 118 and a drain 111. Moreover, another NMOS transistor 170 is disposed over the p-type substrate 100, and the NMOS transistor 170 includes a gate 106, a source 110 and a drain 108. The source 110 of the NMOS transistor 170 is connected with the drain 111 of the NMOS transistor 180, and the source 110 and the drain 111 are disposed in a portion of p-type well region 140, a portion of n-type deep well region 130 and a portion of p-type substrate 100.

Furthermore, the p-type doped region 122 is disposed in the p-type well region 140, and the p-type doped region 122 is laterally adjacent to the source 118 of the NMOS transistor 180. Moreover, the p-type doped region 122 and the source 118 of NMOS transistor 180 and the gate 116 are electrically connected to an input pad 104. The p-type doped region 112 is disposed in p-type substrate 100, and the p-type doped region 112 is laterally adjacent to the drain 108 of NMOS transistor. The p-type doped region 112 and the drain 108 of NMOS transistor 170 and the gate 106 are electrically connected to an output pad 102. In a preferred embodiment, the output pad 102 is, for example, grounded.

When the device is normally operated under positive bias, a positive bias is input from the input pad 104. The protection circuit of the invention would not be activated because the normal bias level does not reach the threshold of the device. However, when a positive electro-static current attacks the device, the positive electro-static current may also enter the device from the input pad 104, and thereby activating the electro-static discharge (ESD) protection circuit of the present invention. Referring to FIG. 2, in the electro-static discharge (ESD) protection circuit of the present invention, a pnp parasitic bipolar junction transistor 204 is formed by the p-type well region 140, the n-type deep well region 130 and the p-type substrate 100. Moreover, the n-type deep well region 130, the p-type substrate 100 and the drain 108 also forms a npn parasitic bipolar junction transistor 202. It is noted that when the positive electro-static current enters from the input pad 104 into the p-type doped region 122, the positive electro-static current may flow to the p-type well region 140 and then to the n-type deep well region 130. When the gate is grounded, it is noted that the gated breakdown voltage is lower than the breakdown voltage of the junction. Therefore, the electro-static current will flow from the n-type deep well region 130 via the source 110 to the p-type substrate 100, and thus a breakdown occurs in the area 150 shown by the dotted line. Thereafter, the electro-static current will flow to the drain 108 and leave the device through the output pad 102.

Figure 4:
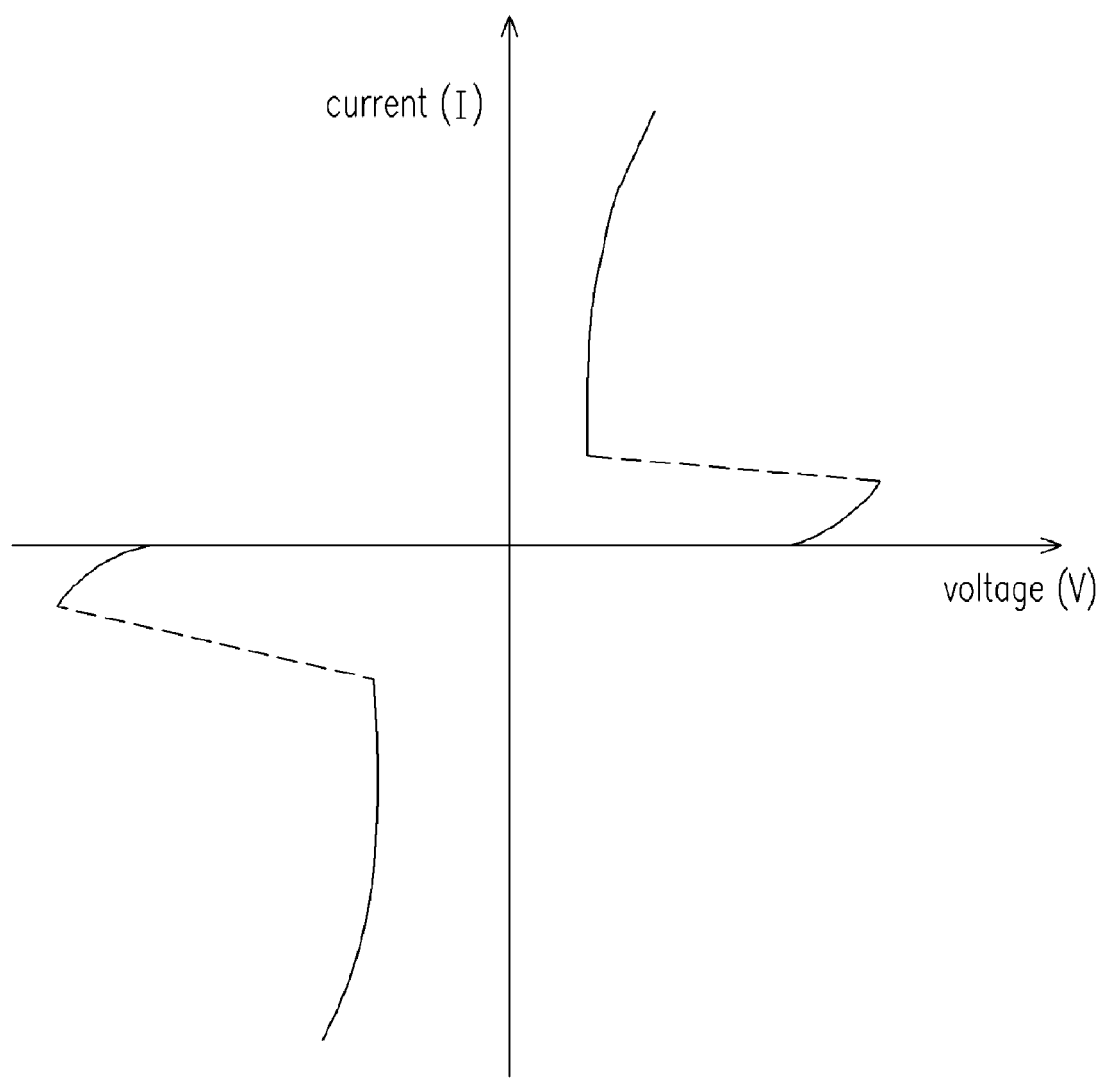
FIG. 4 is a plot of current vs. voltage (I-V curve) of an electro-static discharge (ESD) protection circuit according to a preferred embodiment of the present invention.

Referring to FIG. 2, the base of the pnp parasitic bipolar junction transistor 204 is connected with the collector of the npn parasitic bipolar junction transistor 202. Moreover, the collector of the npn parasitic bipolar junction transistor 202 is connected with the collector of the pnp parasitic bipolar junction transistor 204. In other words, each of the base of the two parasitic bipolar junction transistors is driven by the collector of the other parasitic bipolar junction transistor, and thus a positive feedback loop is formed. Moreover, the pnpn semiconductor structure forms a structure of a silicon control rectifier (SCR). The silicon control rectifier (SCR)

has a specific current-voltage characteristic (I-V curve) as shown in the first quadrant of FIG. 4. When the electro-static discharge (ESD) protection circuit is attacked by a positive electro-static current, the electro-static discharge (ESD) protection circuit is triggered to protect the device against the electro-static current and also the normal operation of the device is not adversely affected by the electro-static discharge (ESD) protection circuit of the present invention.

Figure 3:
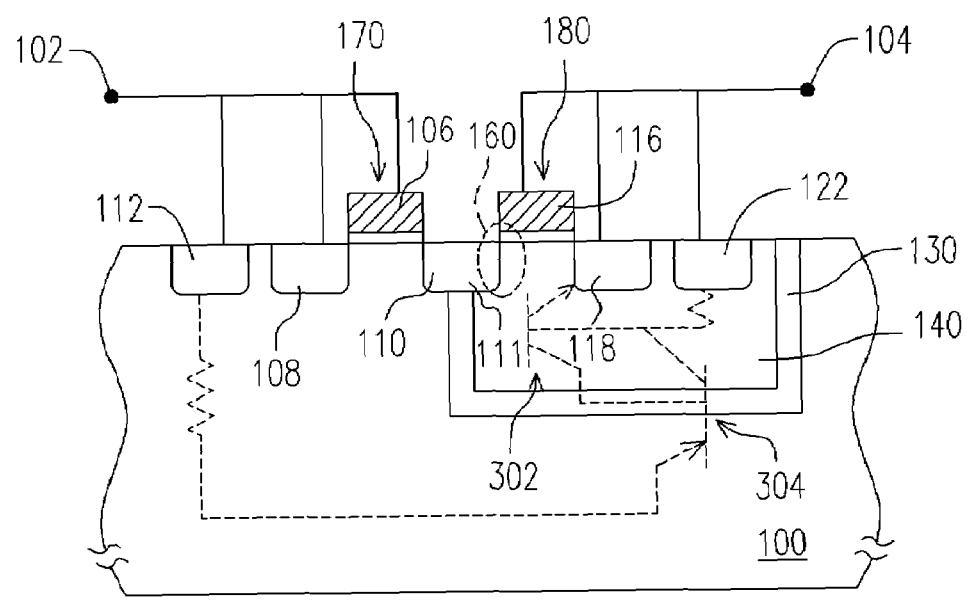
FIG. 3 is a drawing schematically illustrating the formation of a silicon control rectifier (SCR)when the electro-static discharge (ESD) protection circuit is attacked by a negative electro-static current according to a preferred embodiment of the present invention.

Alternatively, when the device is operated under negative bias, a negative bias is input from the input pad 104 of the device. The protection circuit of the invention would not be activated because the normal bias level does not reach the threshold of the device. However, when a negative electro-static current attacks the device, the negative electro-static current may also enter the device from the input pad 104 and thereby activating the electro-static discharge (ESD) protection circuit of the present invention. Here, the negative electro-static current entering from the input pad 104 can be regarded as a positive electro-static current entering from the output pad 102. Referring to FIG. 3, in the electro-static discharge (ESD) protection circuit of the present invention, a pnp parasitic bipolar junction transistor 304 is formed by the p-type substrate 100, the n-type deep well region 130 and the p-type well region 140. Moreover, the n-type deep well region 130, the p-type well region 140 and the source 118 also forms a npn parasitic bipolar junction transistor 302. It is noted that when the positive electro-static current is enters from the output pad 102 to the p-type doped region 112, the positive electro-static current will flow to the p-type substrate 100 and then to the n-type deep well region 130. In the meanwhile, since the gate breakdown voltage is lower than the breakdown voltage of the junction, and therefore the positive electro-static current will flow from the n-type deep well region 130 via the drain 111 to the p-type well region 140, and a breakdown occurs in the area 160 shown by the dotted line. Then, the positive electro-static current will flow to the source 118 and leave the device through the input pad 104.

Referring to FIG. 3, the base of the pnp parasitic bipolar junction transistor 304 is connected with the collector of the npn parasitic bipolar junction transistor 302. Moreover, the base of the npn parasitic bipolar junction transistor 302 is connected with the collector of the pnp parasitic bipolar junction transistor 304. Therefore, each of the bases of the two parasitic bipolar junction transistors is driven by the collector of the other parasitic bipolar junction transistor, and thus a positive feedback loop is formed. Therefore, a pnpn semiconductor structure forms a silicon control rectifier (SCR). Since the silicon control rectifier (SCR) has a specific current-voltage characteristic (I-V curve) as shown in the fourth quadrant of FIG. 4. When the electro-static discharge (ESD) protection circuit is attacked by a negative electro-static current, the electro-static discharge (ESD) protection effect is triggered to protect the device against the electro-static current and also the normal operation of the device is not adversely affected by the electro-static discharge (ESD) protection circuit of the present invention.

Referring to FIG. 4, the current-voltage characteristic (I-V curve) of the electro-static discharge (ESD) protection circuit for the dual polarity I/O pad of the present invention is shown. As shown, the current-voltage characteristics (I-V curve) of protection circuit, when the device is attacked by a positive electro-static current and the current-voltage characteristics (I-V curve) of protection circuit when the device is attacked by a negative electro-static current, are not symmetrical. The reason being, when the electro-static discharge (ESD) protection circuit of the present invention are attacked by the electro-static current of two type of different polarities, the two type of pnpn silicon control rectifier (SCR) structures formed are not totally symmetrical. However, regardless of the type of pnpn silicon control rectifier (SCR) formed, the electro-static discharge (ESD) protection circuit will be triggered to protect the device and also the normal operation of the device is unaffected.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electro-static discharge (ESD) protection circuit for a dual polarity input/output (I/O) pad, comprising:
   a substrate of a first conductive type;
   a deep well region of a second conductive type, disposed in the substrate of the first conductive type;
   a well region of the first conductive type, disposed in the deep well region of the second conductive type;
   a first transistor, disposed over the well region of the first conductive type, wherein the first transistor comprises a first gate, a first source and a first drain;
   a second transistor, disposed over the substrate of the first conductive type, wherein the second transistor comprises a second gate, a second source and a second drain, wherein the second source and the first drain are a common-use doped region, and the common-use doped region is overlapping with the deep well region, the well region, and a portion of the substrate other than the deep well region;
   a first doped region with the first conductive type, disposed in the well region of first conductive type and laterally adjacent to the first source, wherein the first doped region, the first source and the first gate are electrically connected to an input pad; and
   a second doped region with the first conductive type, disposed in the substrate of the first conductive type and laterally adjacent to the second drain, wherein the second doped region, the second drain and the second gate are electrically connected to an output pad.

2. The electro-static discharge (ESD) protection circuit of claim 1, wherein the substrate of first conductive type comprises a p-type substrate.

3. The electro-static discharge (ESD) protection circuit of claim 1, wherein the deep well region of second conductive type comprises a n-type deep well region.

4. The electro-static discharge (ESD) protection circuit of claim 1, wherein the well region of first conductive type comprises a p-type well region.

5. The electro-static discharge (ESD) protection circuit of claim 1, wherein the first transistor and the second transistor comprise a NMOS transistor.

6. The electro-static discharge (ESD) protection circuit of claim 1, wherein the first doped region and the second doped region comprise a p-type doped region.

7. The electro-static discharge (ESD) protection circuit of claim 1, wherein when the input pad receives a positive electro-static current, a first parasitic bipolar junction transistor is formed by the first conductive type well region, the second type deep well region and the first conductive type substrate, and a second parasitic bipolar junction transistor is formed by the second conductive type deep well region, the first conductive type substrate and the second drain, and a positive feedback loop is formed by the first parasitic bipolar junction transistor and the second parasitic bipolar junction transistor.

8. The electro-static discharge (ESD) protection circuit of claim 1, wherein when the input pad receives a negative electro-static current, a first parasitic bipolar junction transistor is formed by the first conductive type substrate, the second conductive type deep well region and the first conductive type well region, and a second parasitic bipolar junction transistor is formed by the second conductive type deep well region, the first conductive type well region and the first source, and a positive feedback loop is formed by the first parasitic bipolar junction transistor and the second parasitic bipolar junction transistor.

* * * * *